(12) United States Patent
Kremmel

(10) Patent No.: US 11,723,508 B2
(45) Date of Patent: Aug. 15, 2023

(54) DOMESTIC APPLIANCE AND ONE-PIECE MODULAR HOUSING THEREFOR

(71) Applicant: Haier US Appliance Solutions, Inc., Wilmington, DE (US)

(72) Inventor: Aldo Vincent Kremmel, Palmyra, IN (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 78 days.

(21) Appl. No.: 17/522,344

(22) Filed: Nov. 9, 2021

(65) Prior Publication Data
US 2023/0148133 A1    May 11, 2023

(51) Int. Cl.
| H05K 5/02 | (2006.01) |
| A47L 15/42 | (2006.01) |
| H05K 7/14 | (2006.01) |

(52) U.S. Cl.
CPC ....... *A47L 15/4274* (2013.01); *A47L 15/4251* (2013.01); *H05K 5/0217* (2013.01); *H05K 7/1427* (2013.01)

(58) Field of Classification Search
USPC .......................................................... 361/752
See application file for complete search history.

(56) References Cited

U.S. PATENT DOCUMENTS

| 4,226,491 | A | * | 10/1980 | Kazama | ............... H05K 7/1461 |
| | | | | | 361/759 |
| 5,432,676 | A | * | 7/1995 | Satoh | .................... G06F 1/1616 |
| | | | | | 361/755 |
| 6,233,155 | B1 | | 5/2001 | Moester | |
| 7,416,421 | B2 | | 8/2008 | Kapino | |
| 9,007,774 | B2 | * | 4/2015 | Furubo | ................ G06F 1/1626 |
| | | | | | 361/728 |
| 9,188,747 | B2 | | 11/2015 | Gniadek | |
| 9,267,621 | B2 | | 2/2016 | Aninger | |
| 9,360,645 | B2 | | 6/2016 | Courchaine | |
| 9,723,733 | B2 | * | 8/2017 | Lebo | ...................... G02B 6/428 |
| 9,967,993 | B1 | * | 5/2018 | Walker | ................. H05K 7/1418 |
| 10,993,336 | B2 | * | 4/2021 | Leen | ....................... H05K 3/30 |

FOREIGN PATENT DOCUMENTS

DE    102004055819 A1    5/2006

\* cited by examiner

*Primary Examiner* — Hung S. Bui
(74) *Attorney, Agent, or Firm* — Dority & Manning, P.A.

(57) ABSTRACT

A modular housing is provided. The modular housing includes a compartment body, a compartment door, a tube mount, a flat mount, and a screw hole. The compartment body defines a compartment volume for holding circuitry therein. The compartment body includes a bottom section and a set of side sections. The set of side sections includes a first side section, a second side section, and a third side section. The tube mount includes a tube mount comprising a snap curved to accept a circular tube, the tube mount extending from the first side section. The flat mount includes a snap configured to accept to a flat rail, the flat mount extending from the third side section. The screw extension defines a screw hole to accept a screw, the screw extension extending from the second side section in the set of side sections.

18 Claims, 12 Drawing Sheets

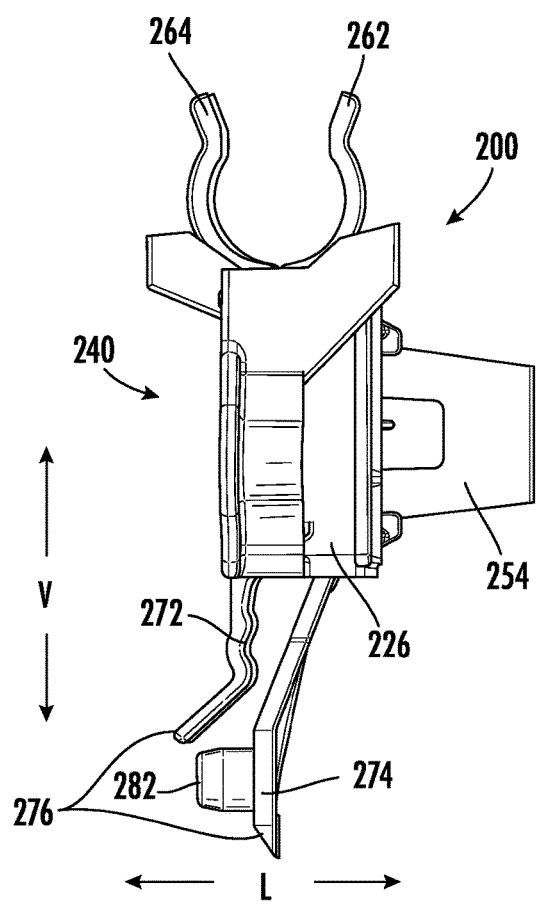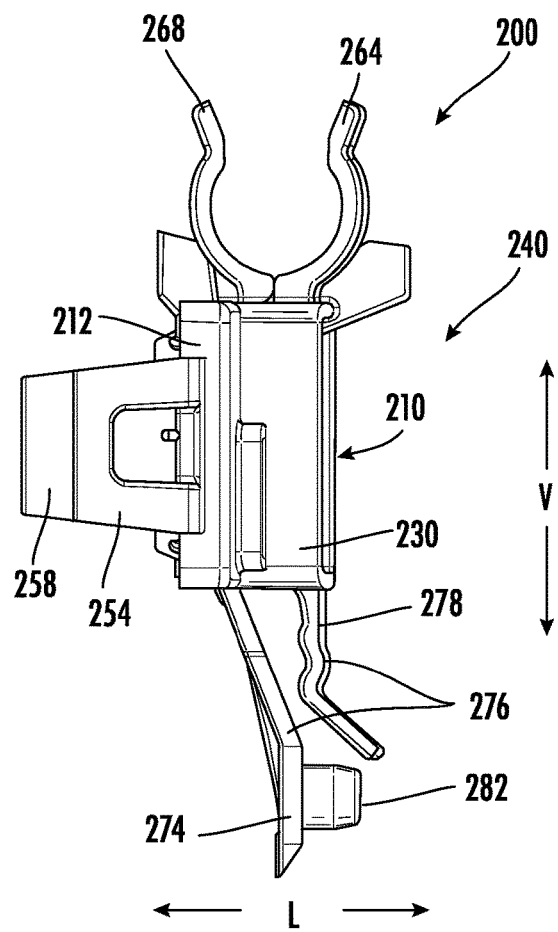
FIG. 9
FIG. 10

DOMESTIC APPLIANCE AND ONE-PIECE MODULAR HOUSING THEREFOR

FIELD OF THE INVENTION

The present subject matter relates generally to manufactured parts, and more particularly to modular parts for housing one or more components on an appliance.

BACKGROUND OF THE INVENTION

In manufacturing, modular parts may be useful to aid in production. Furthermore, circuit boards may be used in many manufacturing applications. Circuit boards may benefit from an added layer of protection, or from a stabilizing location within the manufactured piece they are placed into. For example, circuit boards may be placed in appliances such as dishwashers, refrigerators, washers, dryers, ovens, ranges, and the like. Such circuit boards are often placed in a cabinet of the appliance, but the location of a circuit board can vary widely, and what it is connected to within the manufactured piece can also vary widely. A housing for the circuitry may provide a level of stability or some protection from outside elements. Circuitry can be fragile in that it may malfunction when jostled or wet, so a secure place away from interference may be beneficial.

Using a modular housing for circuitry provides many of the benefits mentioned above. Modular housing may need to be attached to a wall within a manufactured piece with a screw, a flat rail, a curved rail, or another position. Different modular housings are built with different attachment systems in order to accommodate where they will be placed within the manufactured piece. Therefore, many different types of modular housings may be required for different applications, resulting in increased costs or assembly time for manufacturers of multiple different appliances.

Accordingly, a modular housing that was able to attach to more than one type of securing place on a manufactured piece would be useful. For example, an appliance built with a modular housing that could be attached in multiple places within that appliance may be desirable.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, a modular housing is provided. The modular housing may have a lateral vertical and transverse direction. The modular housing may include a compartment body, and a compartment door. The compartment body may define a compartment volume for holding circuitry therein. The compartment body may include a bottom section and a set of side sections extending nonparallelly from the bottom section. The set of side sections may include a first side section, a second side section, and a third side section. The compartment door may be attached to the compartment body to selectively cover the compartment volume. The modular housing may further include a tube mount, a flat mount, and a screw extension. The tube mount may be curved to accept a circular tube. The tube mount may extend from the first side section. The flat mount may be configured to accept a flat rail. The flat mount may extend from the third side section. The screw extension may define a screw hole to accept a screw. The screw extension may extend from the second side section in the set of side sections.

In another exemplary aspect of the present disclosure, an appliance is provided. The appliance may have a lateral, vertical and transverse direction. The appliance may include a circuit board, a beam and a modular housing. The modular housing may encase the circuit board and may be attached to the beam. The modular housing may include a compartment body, and a compartment door. The compartment body may define a compartment volume. The compartment volume may house the circuit board therein. The compartment body may include a bottom section and a set of side sections extending nonparallelly from the bottom section. The bottom section and the set of side sections may define the compartment volume. The set of side sections may include a first side section, a second side section, and a third side section. The compartment door may be attached to the compartment body to selectively cover the compartment volume. The modular housing may further include a tube mount, a flat mount, and a screw extension. The tube mount may be curved to accept a round rail. The tube mount may extend from the first side section. The flat mount may be configured to accept a flat rail. The flat mount may extend from the third side section. The screw extension may define a screw hole to accept a screw. The screw extension may extend from the second side section in the set of side sections.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 9 provides an alternate side, open view of the exemplary embodiment of the modular housing of FIG. 3;

FIG. 10 provides a perspective, closed view of the exemplary embodiment of the modular housing of FIG. 3;

Use of the same of similar reference numerals in the figures denotes the same or similar features unless the context indicates otherwise.

DETAILED DESCRIPTION

Figure 1:
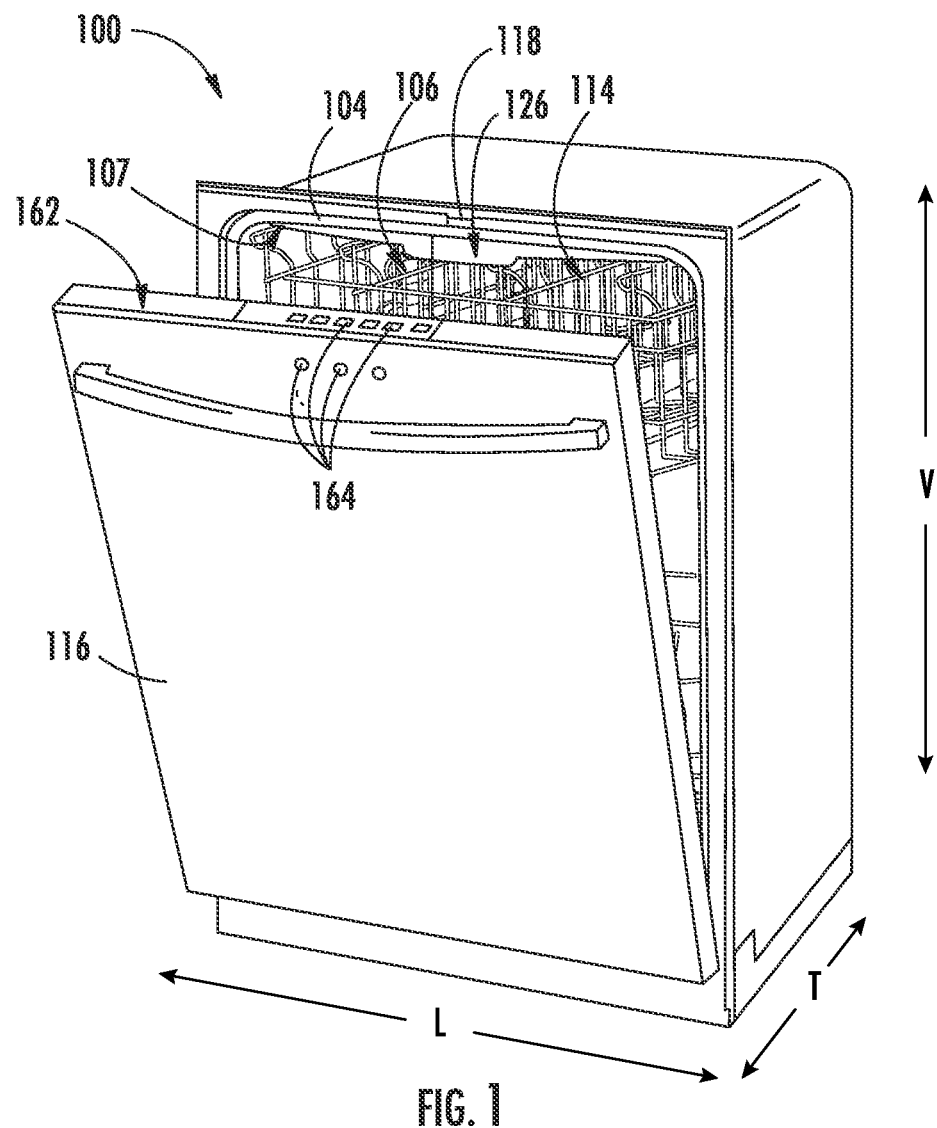
FIG. 1 provides a perspective view of an exemplary embodiment of an appliance of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the term "or" is generally intended to be inclusive (i.e., "A or B" is intended to mean "A or B or both"). The terms "first," "second," and "third" may be used interchangeably to distinguish one component from another and are not intended to signify location or importance of the individual components. The terms "upstream" and "downstream" refer to the relative flow direction with respect to fluid flow in a fluid pathway. For example, "upstream" refers to the flow direction from which the fluid flows, and "downstream" refers to the flow direction to which the fluid flows. Terms such as "left," "right," "front," "back," "top," or "bottom" are used with reference to the perspective of a user accessing the appliance (e.g., when the door is in the closed position). For example, a user stands in front of the appliance to open a door and reaches into the internal chamber(s) to access items therein.

Approximating language, as used herein throughout the specification and claims, may be applied to modify any quantitative representation that could permissibly vary without resulting in a change in the basic function to which it is related. Accordingly, a value modified by a term or terms, such as "generally," "about," "approximately," and "substantially," are not to be limited to the precise value specified. In at least some instances, the approximating language may correspond to the precision of an instrument for measuring the value, or the precision of the methods or machines for constructing or manufacturing the components or systems. For example, the approximating language may refer to being within a 10 percent margin (i.e., including values within ten percent greater or less than the stated value). In this regard, for example, when used in the context of an angle or direction, such terms include within ten degrees greater or less than the stated angle or direction (e.g., "generally vertical" includes forming an angle of up to ten degrees in any direction, such as, clockwise or counterclockwise, with the vertical direction V).

As used herein, the term "article" may refer to, but need not be limited to dishes, pots, pans, silverware, and other cooking utensils and items that can be cleaned in a dishwashing appliance. The term "wash cycle" is intended to refer to one or more periods of time during which a dishwashing appliance operates while containing the articles to be washed and uses a detergent and water, preferably with agitation, to e.g., remove soil particles including food and other undesirable elements from the articles. The term "rinse cycle" is intended to refer to one or more periods of time during which the dishwashing appliance operates to remove residual soil, detergents, and other undesirable elements that were retained by the articles after completion of the wash cycle. The term "drain cycle" is intended to refer to one or more periods of time during which the dishwashing appliance operates to discharge soiled water from the dishwashing appliance. The term "wash fluid" refers to a liquid used for washing or rinsing the articles and is typically made up of water that may include other additives such as detergent or other treatments. Furthermore, as used herein, terms of approximation, such as "approximately," "substantially," or "about," refer to being within a ten percent margin of error.

Figure 2:
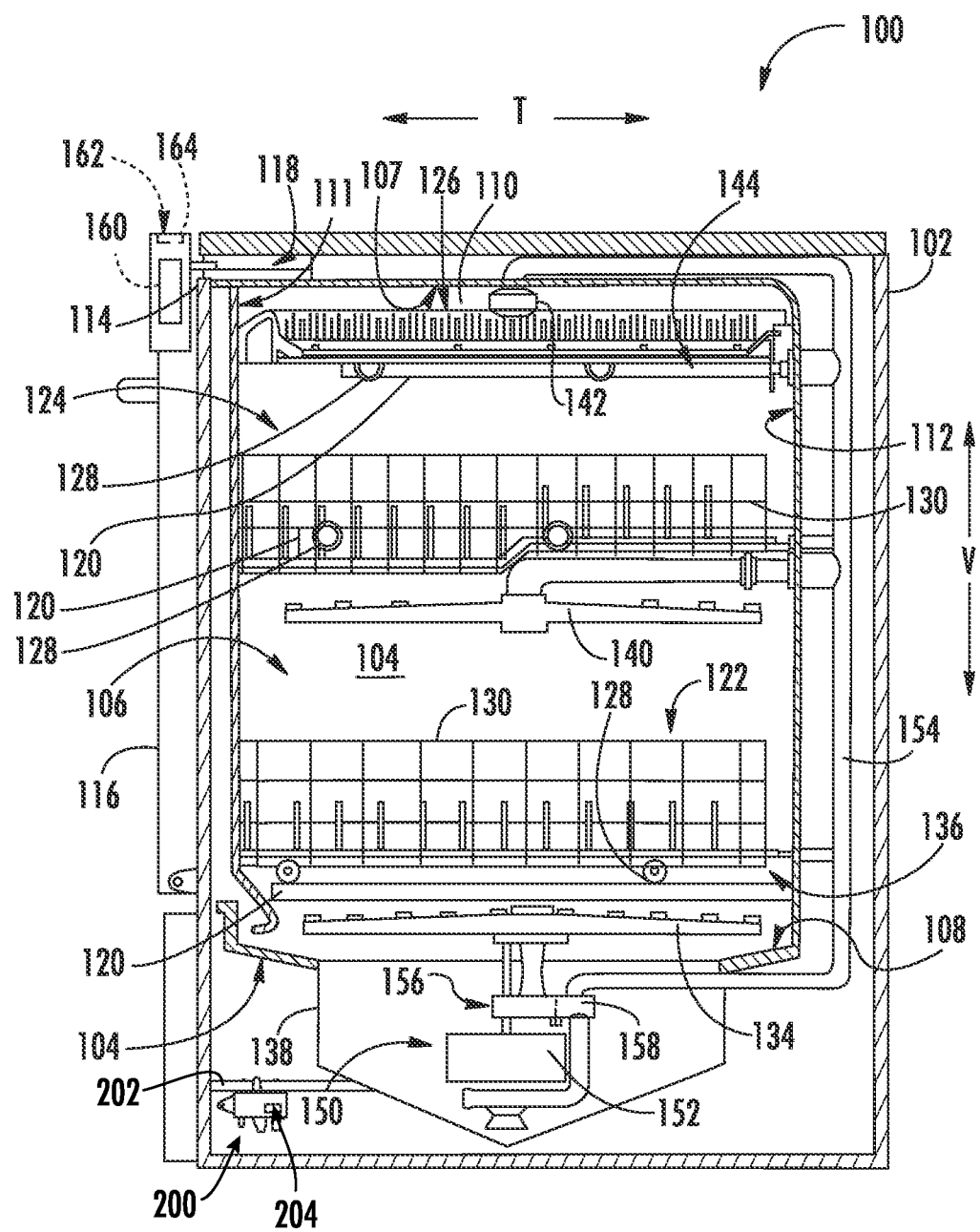
FIG. 2 provides a side, cross sectional view of the appliance of FIG. 1.

FIGS. 1 and 2 depict an exemplary domestic dishwasher or dishwashing appliance 100 that may be configured in accordance with aspects of the present disclosure. For the particular embodiment of FIGS. 1 and 2, the dishwasher 100 includes a cabinet 102 (FIG. 2) having a tub 104 therein that defines a wash chamber 106. As shown in FIG. 2, tub 104 extends between a top 107 and a bottom 108 along a vertical direction V, between a pair of side walls 110 along a lateral direction L, and between a front side 111 and a rear side 112 along a transverse direction T. Each of the vertical direction V, lateral direction L, and transverse direction T are mutually perpendicular to one another.

The tub 104 includes a front opening 114 and a door 116 hinged at its bottom for movement between a normally closed vertical position (shown in FIG. 2), wherein the wash chamber 106 is sealed shut for washing operation, and a horizontal open position for loading and unloading of articles from the dishwasher 100. According to exemplary embodiments, dishwasher 100 further includes a door closure mechanism or assembly 118 that is used to lock and unlock door 116 for accessing and sealing wash chamber 106.

As best illustrated in FIG. 2, tub side walls 110 accommodate a plurality of rack assemblies. More specifically, guide rails 120 may be mounted to side walls 110 for supporting a lower rack assembly 122, a middle rack assembly 124, and an upper rack assembly 126. As illustrated, upper rack assembly 126 is positioned at a top portion of wash chamber 106 above middle rack assembly 124, which is positioned above lower rack assembly 122 along the vertical direction V. Each rack assembly 122, 124, 126 is adapted for movement between an extended loading position (not shown) in which the rack is substantially positioned outside the wash chamber 106, and a retracted position (shown in FIGS. 1 and 2) in which the rack is located inside the wash chamber 106. This is facilitated, for example, by rollers 128 mounted onto rack assemblies 122, 124, 126, respectively. Although guide rails 120 and rollers 128 are illustrated herein as facilitating movement of the respective rack assemblies 122, 124, 126, it should be appreciated that any suitable sliding mechanism or member may be used according to alternative embodiments.

Some or all of the rack assemblies 122, 124, 126 are fabricated into lattice structures including a plurality of wires or elongated members 130 (for clarity of illustration, not all elongated members making up rack assemblies 122, 124, 126 are shown in FIG. 2). In this regard, rack assemblies 122, 124, 126 are generally configured for supporting articles within wash chamber 106 while allowing a flow of wash fluid to reach and impinge on those articles, e.g., during a cleaning or rinsing cycle. According to another exemplary embodiment, a silverware basket (not shown) may be removably attached to a rack assembly, e.g., lower rack assembly 122, for placement of silverware, utensils, and the like, that are otherwise too small to be accommodated by rack 122.

Dishwasher 100 further includes a plurality of spray assemblies for urging a flow of water or wash fluid onto the articles placed within wash chamber 106. More specifically, as illustrated in FIG. 2, dishwasher 100 includes a lower spray arm assembly 134 disposed in a lower region 136 of wash chamber 106 and above a sump 138 so as to rotate in relatively close proximity to lower rack assembly 122. Similarly, a mid-level spray arm assembly 140 is located in an upper region of wash chamber 106 and may be located below and in close proximity to middle rack assembly 124. In this regard, mid-level spray arm assembly 140 may generally be configured for urging a flow of wash fluid up through middle rack assembly 124 and upper rack assembly 126. Additionally, an upper spray assembly 142 may be located above upper rack assembly 126 along the vertical direction V. In this manner, upper spray assembly 142 may be configured for urging or cascading a flow of wash fluid downward over rack assemblies 122, 124, and 126. As further illustrated in FIG. 2, upper rack assembly 126 may further define an integral spray manifold 144, which is generally configured for urging a flow of wash fluid substantially upward along the vertical direction V through upper rack assembly 126.

The various spray assemblies and manifolds described herein may be part of a fluid distribution system or fluid circulation assembly 150 for circulating water and wash fluid in the tub 104. More specifically, fluid circulation assembly 150 includes a pump 152 for circulating water and wash fluid (e.g., detergent, water, or rinse aid) in the tub 104. Pump 152 may be located within sump 138 or within a machinery compartment located below sump 138 of tub 104, as generally recognized in the art. Fluid circulation assembly 150 may include one or more fluid conduits or circulation piping for directing water or wash fluid from pump 152 to the various spray assemblies and manifolds. For example, as illustrated in FIG. 2, a primary supply conduit 154 may extend from pump 152, along rear 112 of tub 104 along the vertical direction V to supply wash fluid throughout wash chamber 106.

As illustrated, primary supply conduit 154 is used to supply wash fluid to one or more spray assemblies, e.g., to mid-level spray arm assembly 140 and upper spray assembly 142. However, it should be appreciated that according to alternative embodiments, any other suitable plumbing configuration may be used to supply wash fluid throughout the various spray manifolds and assemblies described herein. For example, according to another exemplary embodiment, primary supply conduit 154 could be used to provide wash fluid to mid-level spray arm assembly 140 and a dedicated secondary supply conduit (not shown) could be utilized to provide wash fluid to upper spray assembly 142. Other plumbing configurations may be used for providing wash fluid to the various spray devices and manifolds at any location within dishwasher appliance 100.

Each spray arm assembly 134, 140, 142, integral spray manifold 144, or other spray device may include an arrangement of discharge ports or orifices for directing wash fluid received from pump 152 onto dishes or other articles located in wash chamber 106. The arrangement of the discharge ports, also referred to as jets, apertures, or orifices, may provide a rotational force by virtue of wash fluid flowing through the discharge ports. Alternatively, spray arm assemblies 134, 140, 142 may be motor-driven, or may operate using any other suitable drive mechanism. Spray manifolds and assemblies may also be stationary. The resultant movement of the spray arm assemblies 134, 140, 142 and the spray from fixed manifolds provides coverage of dishes and other dishwasher contents with a washing spray. Other configurations of spray assemblies may be used as well. For example, dishwasher 100 may have additional spray assemblies for cleaning silverware, for scouring casserole dishes, for spraying pots and pans, for cleaning bottles, etc. One skilled in the art will appreciate that the embodiments discussed herein are used for the purpose of explanation only and are not limitations of the present subject matter.

In operation, pump 152 draws wash fluid in from sump 138 and pumps it to a diverter assembly 156, e.g., which is positioned within sump 138 of dishwasher appliance 100. Diverter assembly 156 may include a diverter disk (not shown) disposed within a diverter chamber 158 for selectively distributing the wash fluid to the spray arm assemblies 134, 140, 142 or other spray manifolds or devices. For example, the diverter disk may have a plurality of apertures that are configured to align with one or more outlet ports (not shown) at the top of diverter chamber 158. In this manner, the diverter disk may be selectively rotated to provide wash fluid to the desired spray device.

According to an exemplary embodiment, diverter assembly 156 is configured for selectively distributing the flow of wash fluid from pump 152 to various fluid supply conduits, only some of which are illustrated in FIG. 2 for clarity. More specifically, diverter assembly 156 may include four outlet ports (not shown) for supplying wash fluid to a first conduit for rotating lower spray arm assembly 134 in the clockwise direction, a second conduit for rotating lower spray arm assembly 134 in the counter-clockwise direction, a third conduit for spraying an auxiliary rack such as the silverware rack, and a fourth conduit for supply mid-level or upper spray assemblies 140, 142, i.e., such as primary supply conduit 154.

The dishwasher 100 is further equipped with a controller 160 to regulate operation of the dishwasher 100. The controller 160 may include one or more memory devices and one or more microprocessors, such as general or special purpose microprocessors operable to execute programming instructions or micro-control code associated with a cleaning cycle. The memory may represent random access memory such as DRAM, or read only memory such as ROM or FLASH. In one embodiment, the processor executes programming instructions stored in memory. The memory may be a separate component from the processor or may be included onboard within the processor. Alternatively, controller 160 may be constructed without using a microprocessor, e.g., using a combination of discrete analog or digital logic circuitry (such as switches, amplifiers, integrators, comparators, flip-flops, AND gates, and the like) to perform control functionality instead of relying upon software.

The controller 160 may be positioned in a variety of locations throughout dishwasher 100. In the illustrated embodiment, the controller 160 may be located within a control panel area 162 of door 116 as shown in FIGS. 1 and 2. In such an embodiment, input/output ("I/O") signals may be routed between the control system and various operational components of dishwasher 100 along wiring harnesses that may be routed through the bottom of door 116. Typically, the controller 160 includes a user interface panel/controls 164 through which a user may select various operational features and modes and monitor progress of the dishwasher 100. In one embodiment, the user interface 164 may represent a general purpose I/O ("GPIO") device or functional block. In one embodiment, the user interface 164 may include input components, such as one or more of a variety of electrical, mechanical, or electro-mechanical input devices including rotary dials, push buttons, and touch pads. The user interface 164 may include a display component, such as a digital or analog display device designed to provide operational feedback to a user. The user interface 164 may be in communication with the controller 160 via one or more signal lines or shared communication busses.

Controller 160 may be in operative communication with a circuit board 204, located below tub 104 and internal to a modular housing 200. Circuit board 204 may direct electrical signals throughout dishwasher appliance 100 upon receipt of operative directions from controller 160. In some embodiments, circuit board 204 may direct electrical signals to only a part of dishwasher appliance 100, with at least a second circuit board (not shown) directing electrical signals to other elements of dishwasher appliance 100, at the direction of controller 160.

Dishwasher appliance 100 may also be configured to communicate wirelessly with a cloud-server that may include a database or may be, e.g., a cloud-based data storage system and may also include image recognition and processing capabilities including artificial intelligence as further described below. For example, appliance 100 may communicate with cloud-server over the Internet, and appliance 100 may access via WI-FI®, such as from a WI-FI® access point in a user's home or through a mobile device. Alternatively, dishwasher appliance 100 may be equipped with such image recognition and processing capabilities as part of controller 160 or other components onboard appliance 100.

While dishwasher 100 is shown, it should be appreciated that the invention is not limited to any particular appliance and could be used in any modular appliance or manufactured part, including washing machines, dryers, refrigerators, ovens, ranges, and any other component having circuitry that requires a housing for circuitry. For example, an apparatus with a bar and a circuit with housing may be provided. The exemplary embodiment depicted in FIGS. 1 and 2 is for illustrative purposes only. For example, an apparatus with a bar and a circuit with housing may be used, and other differences may be applied while remaining within the scope of the present subject matter.

Figure 3:
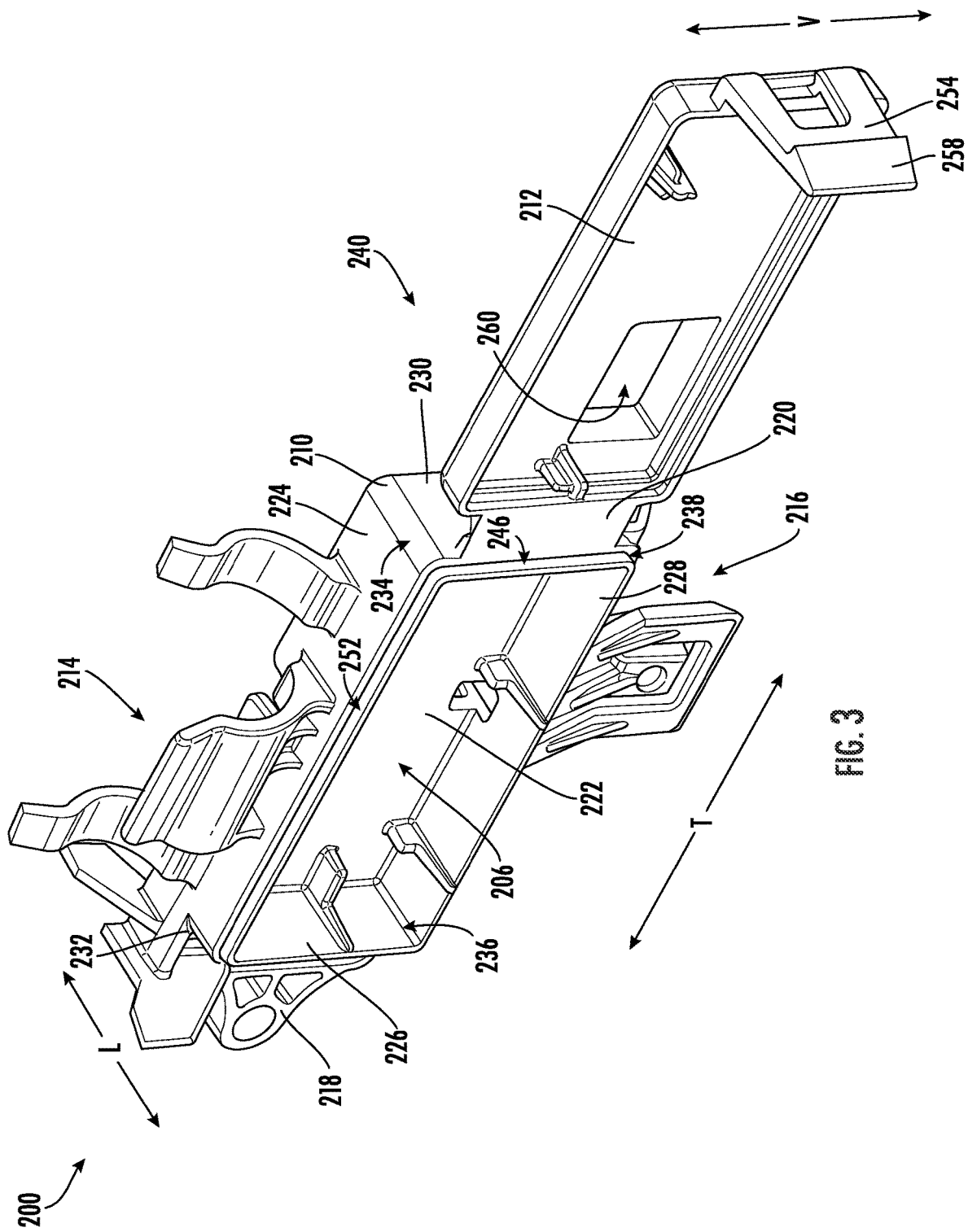
FIG. 3 provides a front, open view of an exemplary embodiment of a modular housing of the present disclosure.

For the remainder of the description, and as shown in FIGS. 3 through 13, directions, including lateral, transverse, and vertical directions, will herein after be given in relation to a modular housing 200, which is shown in an exemplary position in dishwasher 100 in FIG. 2 as attached along beam 202. As shown in FIG. 3, lateral, vertical and transverse directions are hereinafter defined by modular housing 200. The alignment of these directions as defined by modular housing 200, may align with or be parallel to the exemplary position of modular housing 200 in FIG. 2 (where L, V, and T directions are defined relative to dishwasher 100), for clarity of description herein. The position of modular housing 200 in dishwasher 100 is shown in FIG. 2 for exemplary purposes and for ease in defining directions only; modular housing 200 could be placed in any number of positions or alignments within dishwasher 100 or, indeed, in any household appliance requiring a modular housing 200 as described herein.

As shown in FIG. 2, in some embodiments, modular housing 200 is located below tub 104, on a beam 202 that extends transversely across dishwasher 100. In some embodiments, beam 202 is a circular tube. In certain embodiments, beam 202 is a flat rail. In certain other embodiments, beam 202 is an element of appliance 100 that defines a screw hole. According to the arrangement, which will be described in more detail below, modular housing 200 may be attached to beam 202 in any of the above embodiments. In the illustrated embodiment, modular housing 200 encases circuit board 204.

Turning to FIGS. 3 through 7, modular housing 200 includes a compartment body 210, a compartment door 212 attached to compartment body 210. Compartment body 210 included in modular housing 200 defines a compartment volume 206 within compartment body 210. In some embodiments, modular housing 200 further includes a tube mount 214 and a flat mount 216. In certain embodiments, modular housing 200 may further include a screw extension 218. Additionally or alternatively, modular housing 200 includes a connector hole 260 (e.g., defined through compartment door 212). Optionally, connector hole 260 may allow a connector harness (not shown) to pass through compartment door 212 at connector hole 260 and into compartment volume 206.

In optional embodiments, modular housing 200 can serve as a protection for circuitry, such as circuit board 204. Thus, compartment body 210 may hold circuitry (e.g., circuit board 204) within compartment volume 206. In other words, compartment body 210, along with compartment door 212 may be designed to house circuitry such as circuit board 204. In some embodiments, compartment body 210 houses one or more other portions of appliance 100 that would benefit from a level of protection, such as a controller 160, a camera (not shown), or any other part of appliance 100 that would benefit from being placed in a compartment body 210 of a modular housing 200.

Modular housing 200 may also attach to a variety of beams, tubes, rails, or places within an appliance, such as dishwasher appliance 100, which may make modular housing 200 useful in a variety of locations within appliance 100. In some embodiments, it may be useful to include more than one modular housing 200 to cover more than one circuitry, if more than one circuitry is included in appliance 100.

As shown, compartment body 210 defines compartment volume 206. In some embodiments, circuit board 204 is disposed therein (see FIG. 2). Compartment body 210 is connected to compartment door 212. In some embodiments, compartment body 210 is connected to compartment door by way of a resilient pleat 220 extending between compartment door 212 and compartment body 210.

Compartment body 210 includes a bottom section 222 and a set of side sections, (e.g., sections 224, 226, 228). The set of side sections each extend nonparallelly from bottom section 222 (i.e., such that each side section is nonparallel to the bottom section 222). In some embodiments, compartment body 210 includes a first side section 224, a second side section 226, and a third side section 228 in the set of side sections. In certain embodiments, compartment body 210 includes a fourth side section 230 in the set of side sections.

As shown, compartment body 210 and compartment door 212 may generally form an enclosure with bottom section 222 and side sections 224, 226, 228, 230. For instance, compartment body 210 and compartment door 212 may form a box (e.g., shaped as a rectangular prism). Nonetheless, it is understood that any suitable shape may be provided or formed. Generally, compartment body 210 may be a three-dimensional shape as desired to house components (e.g. circuitry or circuit board 204) of appliance 100 within appliance 100. Optionally, compartment body 210 may connect smoothly or seamlessly from bottom section 222 to side sections 224, 226, 228, or fourth side section 230. In the illustrated embodiments, compartment body 210 forms a corner where bottom section meets each side section 224, 226, 228, 230.

Figure 5:
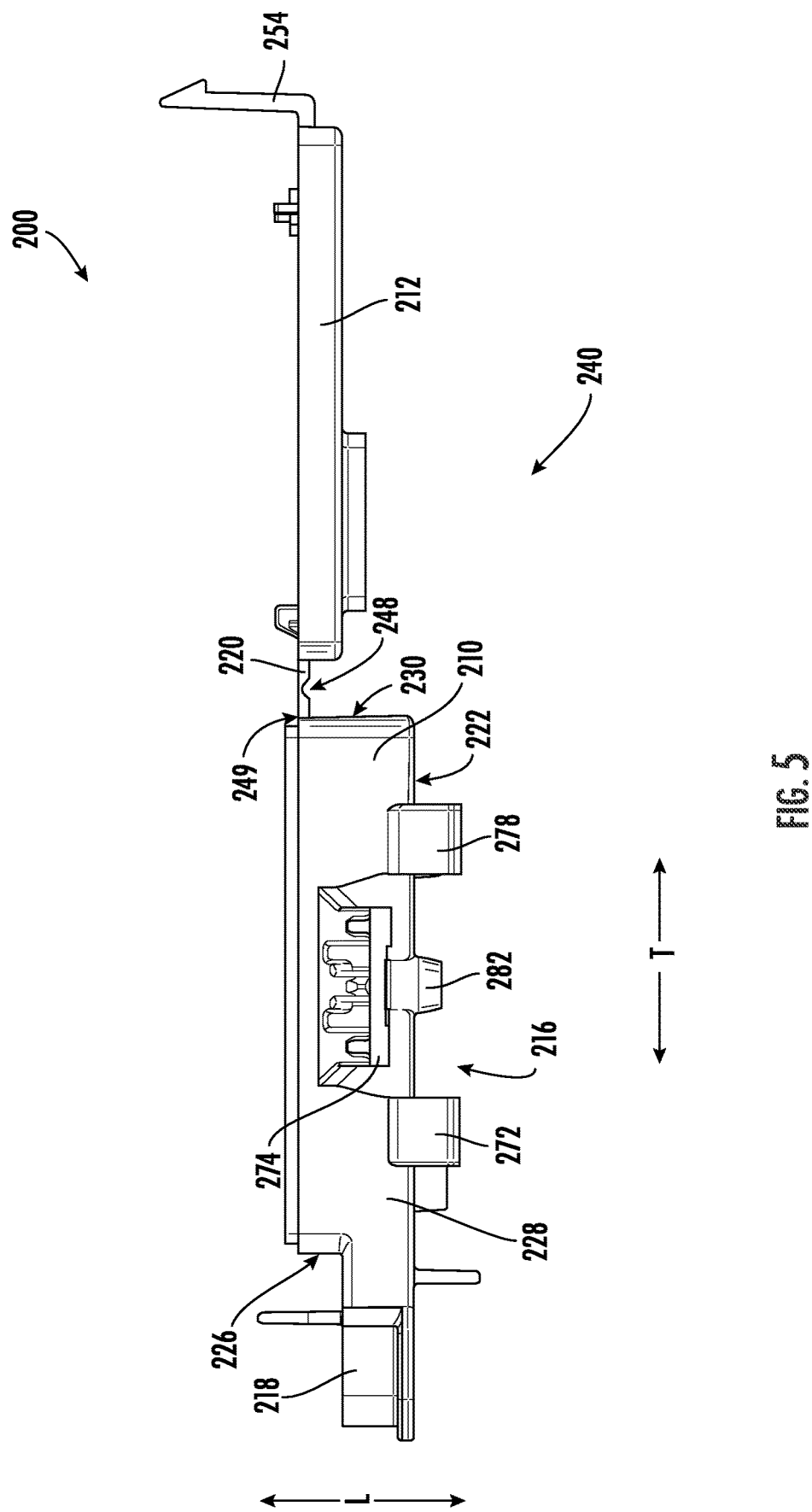
FIG. 5 provides an alternate side, open view of the exemplary embodiment of the modular housing of FIG. 3.
Figure 6:
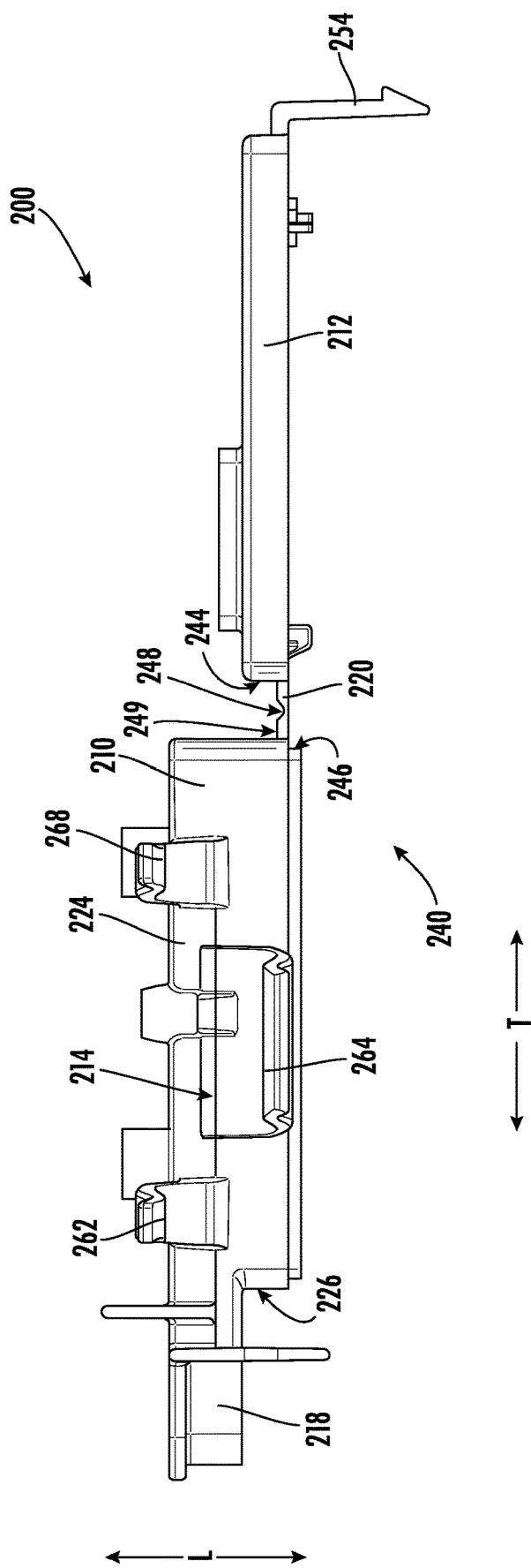
FIG. 6 provides a back, open view of the exemplary embodiment of the modular housing of FIG. 3.
Figure 7:
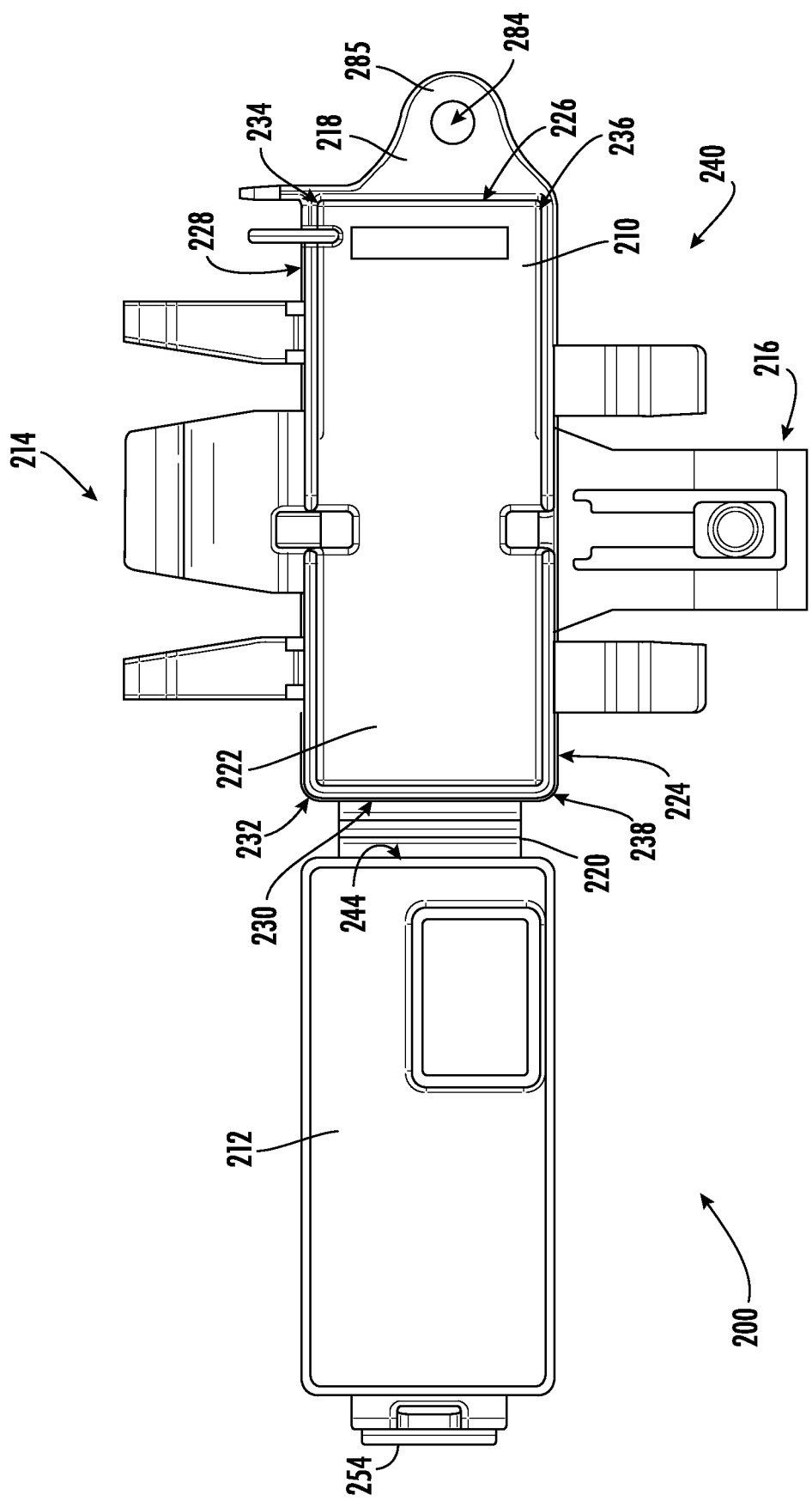
FIG. 7 provides a perspective, open view of the exemplary embodiment of the modular housing of FIG. 3.

As shown especially in FIGS. 3 and 7, bottom section 222 is located on a lateral end of modular housing 200. In some embodiments, bottom section 222 is orthogonal with the set of side sections 224, 226, 228 and 230. Each side section may extend nonparallelly from an edge of bottom section 222. For example, first section 224 extends orthogonal to a vertical edge of bottom section 222 in FIGS. 3 and 7. Bottom section 222 further defines lateral end of compartment volume 206. In some embodiments, bottom section 222 is a planar section, being relatively flat (e.g., parallel to the lateral direction L or transverse direction T), as shown in FIGS. 3 through 7. In alterative embodiments, bottom section 222 is curved, such as a concave curve or rounded (not shown).

Returning to FIGS. 3 through 7, first side section 224 is attached to bottom section 222 and extends from bottom section 222. As shown in FIG. 3, first side section 224 extends laterally outward and roughly perpendicular to bottom section 222. In the illustrated embodiment, first side section 224 extends in the transverse direction T, and is attached to second side section 226 on a transverse edge 232 of first side section 224. In turn, first side section 224 is attached to fourth side section 230 on an opposite transverse edge 234 of first side section 224.

As shown, second side section 226 may extend vertically along a transverse edge of bottom section 222. Second side section 226 may extend laterally outward and roughly perpendicular to bottom section 222. In the illustrated embodiment, second section 226 is also perpendicular to first section 224. Second section is attached to first section 224 as described above. Second section 226 is attached to third section 228 at and a lower vertical edge 236 of second section 226.

Similarly, third side section 228 may extend transversely along a vertical lower edge of bottom section 222. Third side section 228 may extend laterally outward and roughly perpendicular to bottom section 222 and to second section 226. In the illustrated embodiment, third section 228 is roughly parallel with first section 224. Third section 228 is attached to second section 226 as described above and to fourth section 230 at a lower transverse edge 238.

Additionally or alternatively, fourth section 230 may extend transversely along a transverse edge of bottom section 222, this transverse edge of bottom section 222 opposite to the transverse edge of bottom section 222 that second section 226 is attached to. Fourth section 230 may extend laterally outward and roughly perpendicular to bottom section 222, first section 224, and third section 228. As shown, fourth section 230 is roughly parallel with second section 226. Fourth section 230 is attached to third section 228 at lower transverse edge 238 and to first section 224 at transverse edge 232.

Modular housing 200 has an open position 240 and a closed position 242. In open position, and as shown in FIGS. 3 through 7, compartment door 212 is transversely adjacent to compartment body 210 and is attached to compartment body 210 by way of resilient pleat 220. In closed position, and as shown in FIGS. 2 and 8 through 13, compartment door 212 is laterally aligned with compartment body 210. In some embodiments, compartment door 212 is laterally aligned with bottom section 222 of compartment body 210 when in closed position 242. Compartment door 212 may be sized to overlap a portion of the set of side sections 224, 226, 228, 230 on compartment body 210 when modular housing 200 is in closed position 242.

Figure 8:
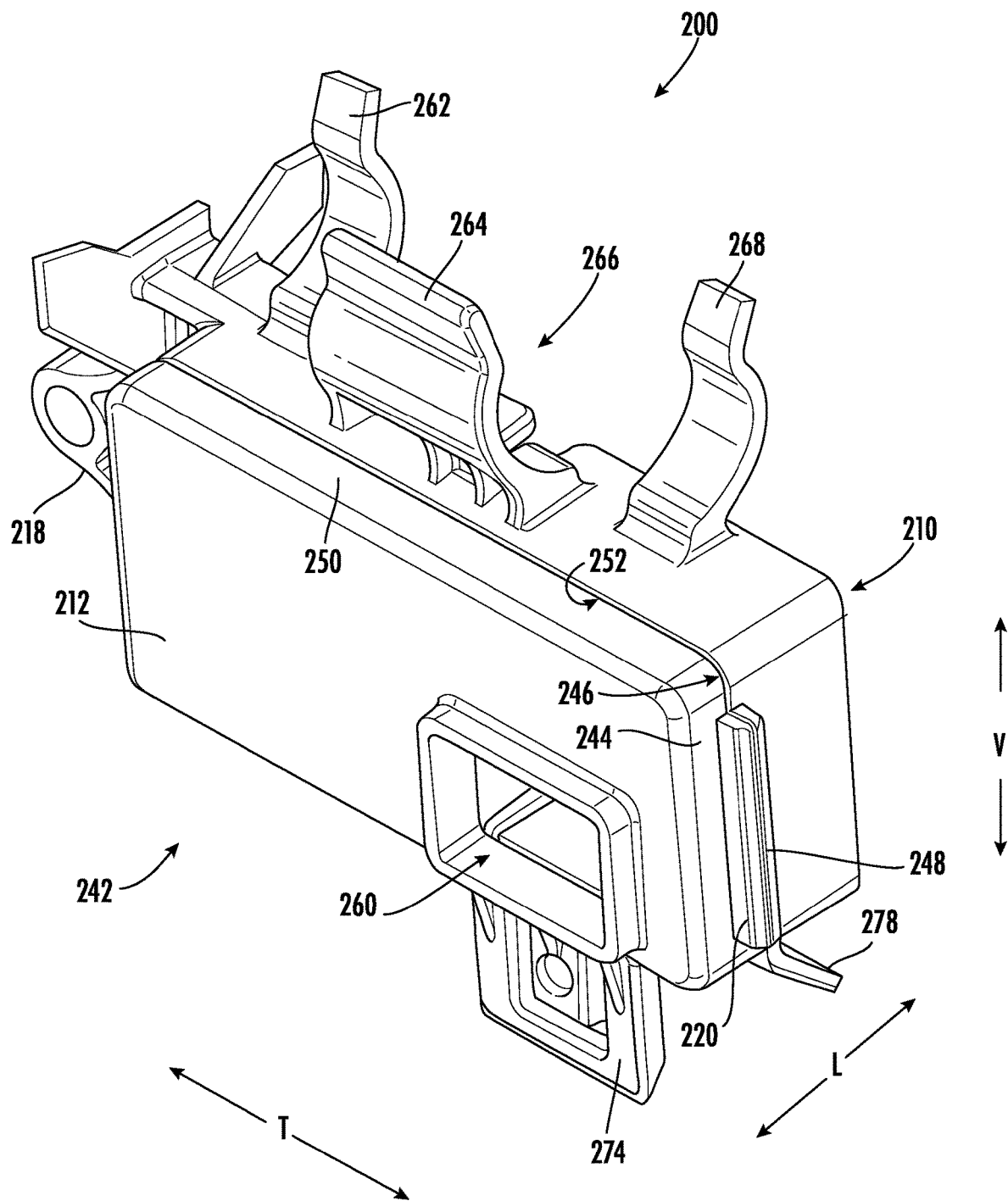
FIG. 8 provides a side, open view of the exemplary embodiment of the modular housing of FIG. 3.

FIG. 3 shows modular housing 200 in open position 240. FIG. 8 shows modular housing 200 in closed position 242. As shown in FIG. 3, compartment door 212 allows modular housing 200 to accept an article for housing, such as circuit board 204, when modular housing 200 is in open position 240. As shown in FIG. 8, compartment door 212 allows modular housing 200 to encase the article for housing, such as circuit board 204, when modular housing 200 is in closed position 242. In closed position 242, compartment door 212 selectively covers compartment volume 206. In some embodiments, compartment door 212 overlaps a portion of each of sections 224, 226, 228, 230 in the set of side sections of compartment body 210. Furthermore, as shown in FIG. 8, compartment door 212 is attached to resilient pleat 220. In some embodiments, resilient pleat 220 folds over on itself between open position 240 and closed position 242. During use, resilient pleat 220 may allow compartment door 212 to remain attached to compartment body 210 during movement between open position 240 and closed position 242.

Figure 4:
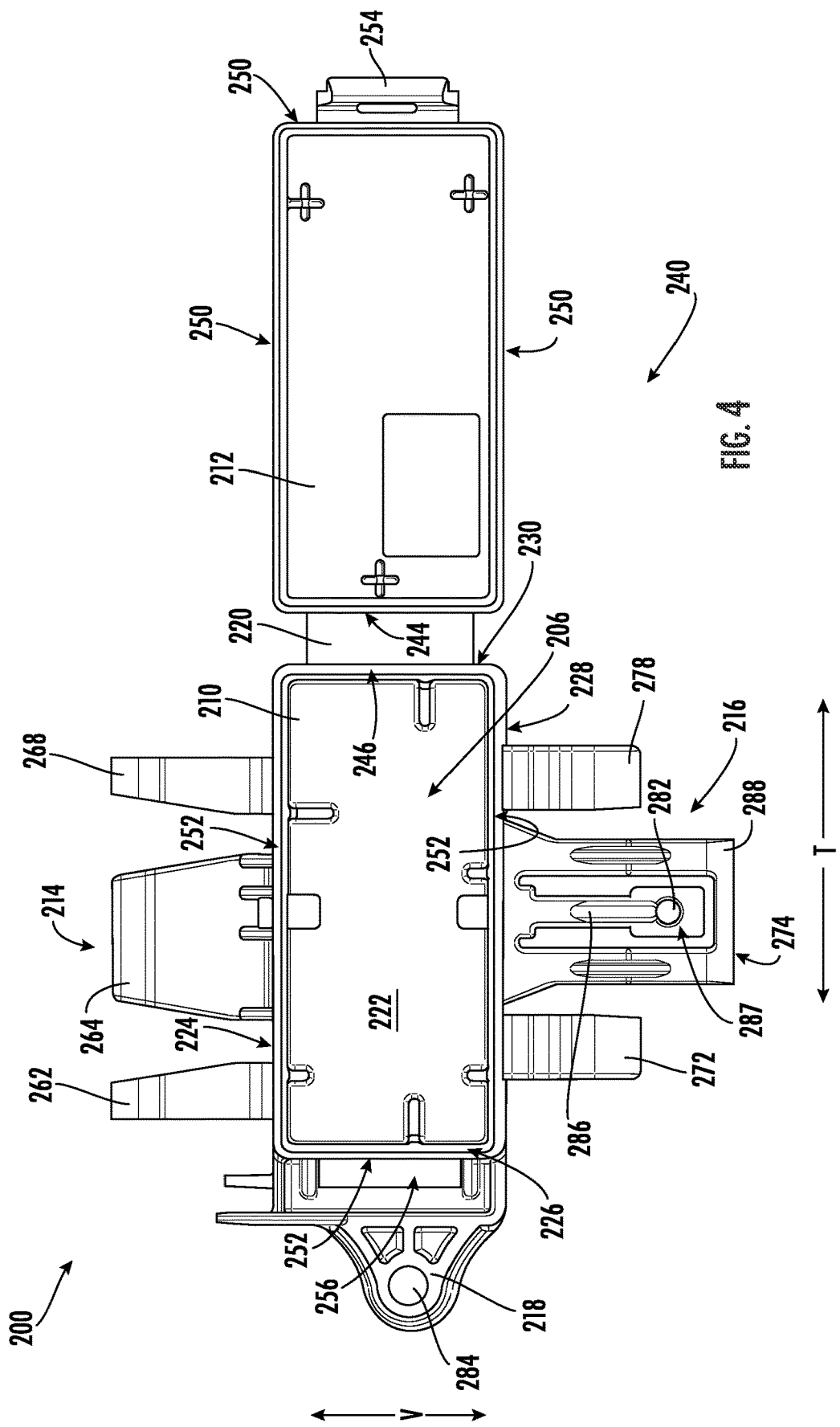
FIG. 4 provides a side, open view of the exemplary embodiment of the modular housing of FIG. 3.

In some embodiments, compartment door 212 includes a peripheral rim 244. As shown in FIGS. 3, 4 and 5, peripheral rim 244 is attached to resilient pleat 220. As shown in FIG. 8, when modular housing 200 is in closed position 242, peripheral rim 244 is coplanar with fourth side section 230. As would be understood, peripheral rim 244 is aligned along lateral direction L when modular housing 200 is in closed position 242. In some embodiments, peripheral rim 244 overlaps a recessed portion 246 of fourth section 230 when in closed position 242.

Resilient pleat 220 is bendably secured to compartment door 212 and to compartment body 210. In some embodiments, resilient pleat 220 extends between compartment door 212 and compartment body 210. In the illustrated embodiment, resilient pleat 220 extends from fourth side section 230 to peripheral rim 244. Additionally or alternatively, resilient pleat 220 moves with compartment door 212 relative to compartment body 210 between open position 240 and closed position 242. For instance, as shown in FIG. 8, resilient pleat 220 may bend over itself transversely in closed position 242. In turn, as shown in FIG. 7, resilient pleat 220 may open out flat transversely in open position 240. In some embodiments, and as shown in FIGS. 5 and 6, resilient pleat 220 decreases in thickness at a central portion 248 of resilient pleat 220. For instance, the thickness of central portion 248 may decrease relative to a thickness of outer portions 249 of resilient pleat 220. Thicknesses of resilient pleat 220 as used herein are referring to thicknesses in the transverse direction T when compartment door is in the open position 240. In some embodiments, reduced thickness in central portion 248 aids in allowing resilient pleat 220 to fold as compartment door 212 moves between open position 240 and closed position 242.

In some embodiments, compartment door 212 is selectively held in friction fit engagement with compartment body 210 in closed position 242. As shown in FIG. 4, peripheral rim 244 may extend forming a door rim 250 around all sides of compartment door 212. Correspondingly, recessed portion 246 of forth section 230 may also be continued with recessed portions 252 for the remaining three side sections 224, 226, 228. As shown in FIG. 8, in closed position 242, door rim 250 and peripheral rim 244, may cover recessed portions 246, 252 side sections 224, 226, 228, 230 of compartment door 212. In some embodiments, this overlap may hold compartment door 212 in friction fit engagement with compartment body 210 in closed position 242.

Figure 12:
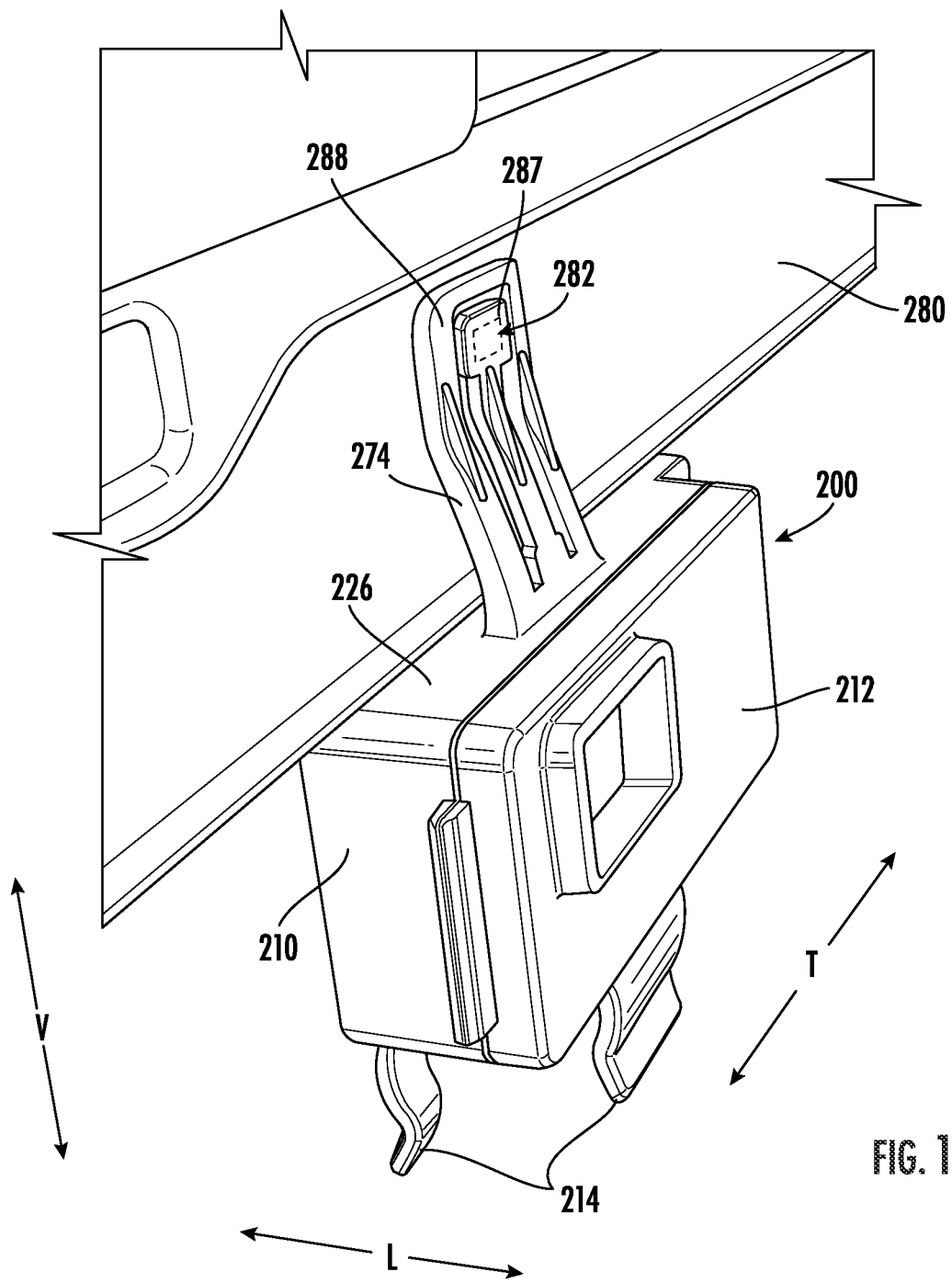
FIG. 12 provides a perspective view of the exemplary embodiment of the modular housing of FIG. 3 attached to a flat rail.

In some embodiments, a fastener 254 aids in holding compartment door 212 in closed position 242 against compartment body 210. Fastener 254 may attach into a fastening void 256 defined by a side section (e.g., second side section 226). Fastening void 256 may be directed to allow a portion of fastener 254 to pass through fastening void 256 when in closed position 242, as shown in FIG. 12. In some embodiments, fastening void 256 is adjacent to screw extension 218. In certain embodiments, screw extension 218 extends further out transversely from compartment body 210 as compared to the transverse position of fastening void 256.

Additionally or alternatively, fastener 254 may include clip 258. Clip 258 may secure compartment door 212 in closed position 242 (e.g., by passing through fastening void 256). In some embodiments, clip 258 creates a friction fit engagement with second side section 226 at fastening void 256. In certain embodiments, clip 258 may be flexed to disengage from fastening void 256, allowing modular housing 200 to return to open position 240.

In some embodiments, fastener 254 may be any fastening mechanism including snaps, clips, or other removably attaching elements to hold compartment door 212 in closed position 242, as known in the art.

In some alternate embodiments, and as shown in FIG. 2, modular housing 200 may include circuit board 204. According to the arrangement, circuit board 204 may be held within compartment volume 206. Additionally or alternatively, circuit board 204 may be surrounded by compartment body 210. When modular housing 200 is in closed position 242, circuit board 204 may be further surrounded by compartment door 212.

Circuit board 204 may be connected to a connector harness (not shown). Connector harness may extend from circuit board 204, through a connector hole 260, and extend out of modular housing 200. Connector hole 260 is defined through compartment door 212. In some embodiments, connector hole 260 is in fluid communication with compartment volume 206 when compartment door 212 is in closed position 242. As would be understood, connector hole 260 allows the connector harness (not shown) to pass through compartment door 212 and into compartment volume 206.

Figure 11:
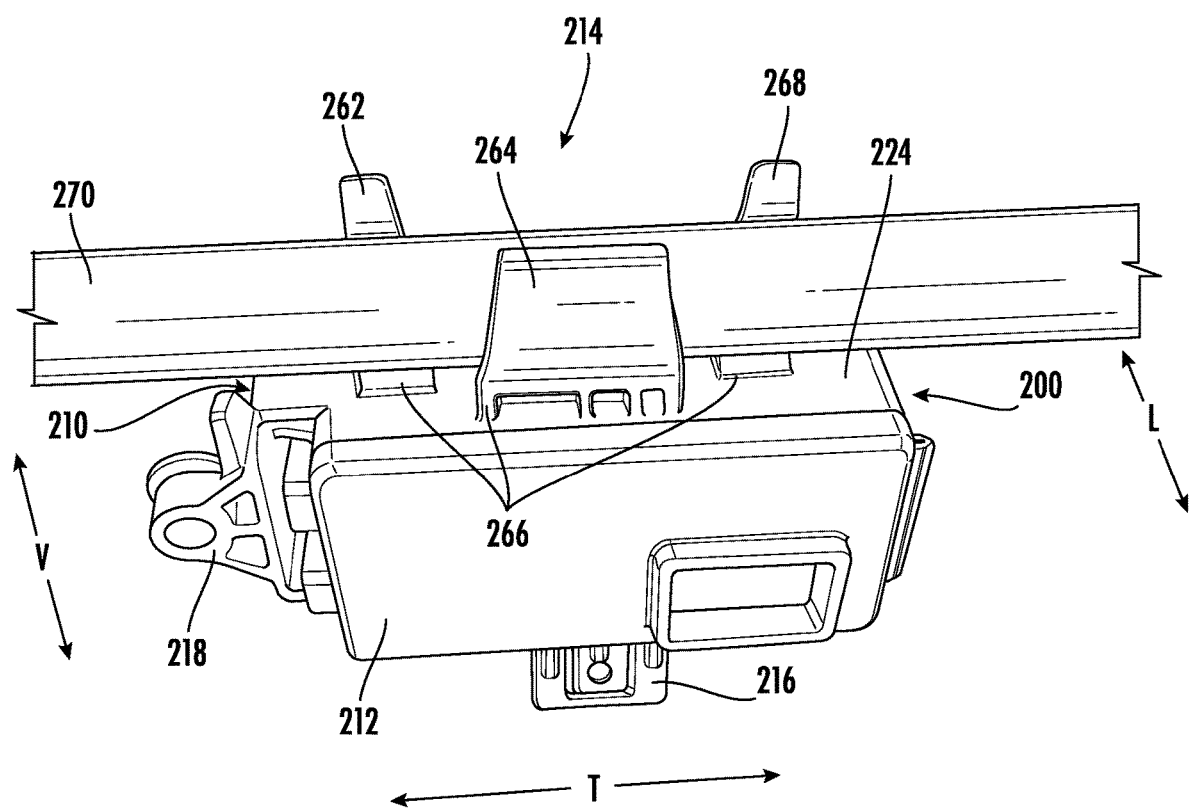
FIG. 11 provides a perspective view of the exemplary embodiment of the modular housing of FIG. 3 attached to a round rail.
Figure 13:
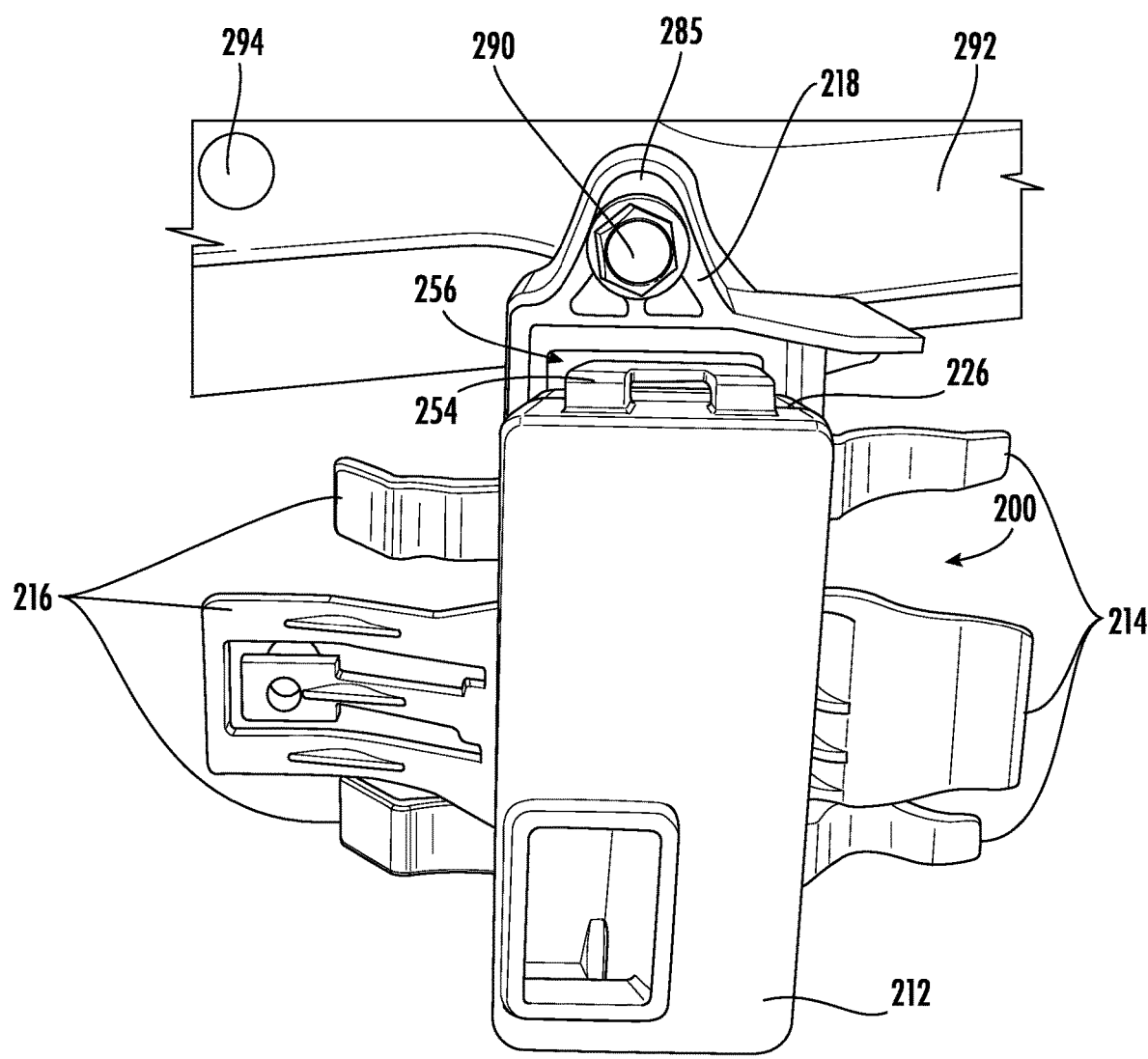
FIG. 13 provides a perspective view of the exemplary embodiment of the modular housing of FIG. 3 attached with a screw.

As described above, modular housing 200 may be attached to beam 202. Beam 202 may be a tube, a flat rail, or an element on appliance 100 defining a screw hole. Generally, modular housing 200 attaches to beam 202 with tube mount 214 if beam 202 is a tube (as shown in FIG. 11), with flat mount 216 if beam 202 is a flat rail (as shown in FIG. 12), or with screw extension 218 if beam 202 is an element defining a screw hole (as shown in FIG. 13). As shown in FIG. 2, in some embodiments, beam 202 is located under tub 104. Additionally, or alternatively, beam 202 may be located within cabinet 102 in any location or position relative to the lateral direction L, transverse direction T, or vertical direction V (e.g., depending on the space limitations or needs of each such embodiment). Each of the mountings, tube mount 214, flat mount 216, and screw extension 218 on modular housing 200 will now be described in more detail.

Turning to FIG. 11, tube mount 214 may extend from first side section 224. As shown, tube mount 214 may extend vertically upwards from first side section 224. Tube mount 214, as shown in FIG. 2, is aligned to allow beam 202 to extend transversely through tube mount 214 when beam 202 is a round rail or tube. During use, tube mount 214 attaches modular housing 200 to a round rail or tube, such as tube 270 (also called circular tube 270 or round rail 270 herein) in FIG. 11.

Tube mount 214 includes a snap 266 curved to accept a round rail or tube 270. Tube mount 214 further includes a first curved foot 262 and a second curved foot 264. In some embodiments, first curved foot 262 and second curved foot 264 comprise snap 266. First curved foot 262 curves laterally opposite to curve of second curved foot 264. First curved foot 262 is spaced apart from second curved foot 264 in cooperative alignment therewith to snap around circular tube 270. In some embodiments, tube mount 214 includes a third curved foot 268. Third curved foot 268 extends from first side section 224, transversely offset from first curved foot 262 and second curved foot 264.

First curved foot 262 may be offset laterally or transversely from second curved foot 264 on first side section 224. For instance, first curved foot 262 may be laterally spaced apart from second curved foot 264. In some embodiments, first curved foot 262 is transversely parallel to third curved foot 268, with third curved foot 268 laterally in line with first curved foot 262. Additionally or alternatively, first curved foot 262 and third curved foot 268 may be offset adjacent to opposing transverse sides of second curved foot 264. In the illustrated embodiment, second curved foot 264 curves laterally in a curve that curves toward a lateral edge of modular housing 200, and first curved foot 262 curves laterally in a curve that curves opposite to curve of second curved foot 264, toward an opposing lateral edge of modular housing 200. In some embodiments, third curved foot 268 curves in the same direction as first curved foot 262. Generally, curves of first, second, and third curved feet 262, 264, 268 are aligned to accept a tube or round rail. During use, first and second curved feet 262, 264 may snap around tube 270 with tube 270 extending between first curved foot 262 and second curved foot 264. In some embodiments, during use, third curved foot 268 may also snap around tube 270, with tube 270 extending between first and third curved feet 262, 268, and second curved foot 264, as shown in FIG. 11.

In some embodiments, a curve of the first curved foot 262 and a curve of the third curved foot 268 are concave and face the second curved foot 264 and the second curved foot 264 is concave on a surface that faces the first curved foot 262 and the third curved foot 268. In additional or alternate embodiments, first, second, and third curved feet 262, 264, 268 are configured to accept round rail 270, snapping into place on round rail 270 with round rail 270 aligned transversely lengthwise in between the second curved foot 264 and the first curved foot 262 and third curved foot 268.

Turning FIGS. 4 and 12, flat mount 216 may extend from third side section 228. It is noted that in FIG. 12, modular housing is upside down vertically from its orientation in FIG. 11. Generally, and as seen in FIG. 4, flat mount 216 may extend vertically downward from third side section 228 or may otherwise be attached to third side section 228.

In some embodiments flat mount 216 includes a snap 276 configured to accept a flat rail 780. Additionally or alternatively, flat mount 216 includes a first leg 272, a second leg 278 and a pin leg 274. In some embodiments, first leg 272 and second leg 278 are laterally aligned and transversely offset from one another. As shown in FIG. 5, first leg 272 may be parallel to second leg 278. In some embodiments, first leg 272 may align parallel to second leg 278 in the lateral direction L. Each leg 274, 278 may be at separate discrete positions extending from third side section 228. Also as shown in FIG. 5, pin leg 274 is offset from first leg 272 and second leg 278. In certain embodiments, pin leg 274 is laterally offset from first and second legs 272, 278 and is transversely in between first and second legs 272, 278.

As shown especially in FIGS. 9 and 10, pin leg 74 may include a pin bump 282. Pin bump 282 generally extends (e.g., laterally) outward from pin leg 274. In some embodiments, pin bump 282 may be aligned to be received within a pin hole in flat rail 280. Pin bump 282 is aligned to fit into a pin hole (not shown) in flat rail 280, snapping modular housing 200 onto flat rail 280 with the use of flat mount 216. First and second legs 272, 278 aid pin leg 274 and pin bump 282 in attaching modular housing 200 to flat rail 280 (e.g., by . . . [describe how they aid]), as shown in FIG. 12.

Returning to FIG. 4, pin leg 274 may have an inner pin leg 286 and an outer pin leg 288. In some embodiments, inner pin leg 286 includes pin bump 282 on an outer end 287 of inner pin leg 286. Inner pin leg 286 extends laterally from third side section 228. In some embodiments, outer end 287 of inner pin leg 286 includes pin bump 282. As shown, outer pin leg 288 extends laterally from third side section 228 on either transverse side of inner pin leg 286, extending vertically beyond pin bump 282. Additionally or alternatively, outer pin leg 288 surrounds pin bump 282 and inner pin leg 286 in the vertical and transverse directions V and T. In certain embodiments, outer pin leg 288 is aligned transversely with inner pin leg 286.

During use, flat mount 216 can accept a flat rail 280, attaching modular housing 200 to flat rail 280. For instance, flat mount 216 may mount to beam 202 when beam 202 is a flat rail (not shown). Pin bump 282 attaches to flat rail 280 through pin hole (not shown) defined by flat rail 280. Though pin hole is not shown in FIG. 12, pin hole may generally be understood to be defined by flat rail 280 at discrete location of pin bump 282 such that pin bump 282 extends into pin hole, attaching modular housing 200 to flat rail 280, as shown. In some embodiments, pin bump 282 extends through pin hole, as would be understood in FIG. 12, attaching modular housing 200 to flat rail 280.

During use, outer pin leg 288 may attach to flat rail 280. In some embodiments, a combination of friction and pressure from outer pin leg 288, inner pin leg 286 with pin bump 282 attaching to flat rail 280 through pin hole, first leg 272, and second leg 278 attach modular housing 200 to flat rail 280.

Turning generally to FIG. 13, screw extension 218 may extend from second side section 226 in the set of side sections. In some embodiments, screw extension extends transversely outward from second side section 226 on modular housing 200.

Screw extension 218 defines a screw hole 284. In some embodiments, screw hole 284 extends laterally through screw extension 218. As shown in FIG. 7, screw hole 284 may be supported by a screw hole ridge 285 surrounding screw hole 284. Screw hole ridge 285 may be an outer transverse edge of modular housing 200.

As shown in FIG. 13, screw hole 284 is defined by screw extension 218. During use, screw hole 284 may accept a screw 290, as shown. For instance, screw 290 extends through screw hole 284 and into a secondary screw hole (not shown) defined by an element 292, modular housing 200 attached to element 292 by use of screw extension 218 and screw 290. Additionally or alternatively, screw hole 284 may be sized to accept screw 290 to attach modular housing 200 to element 292. Element 292 may define secondary screw hole (not shown), secondary screw hole corresponding to screw hole 284. Generally, secondary screw hole may be sized similarly to screw hole 284. Similar sizing of screw hole 284 and secondary screw hole may allow screw 290 to affix to screw hole 284 and to secondary screw hole.

During use, screw extension 218 may be attached by screw 290 to element 292 with a secondary screw hole (not shown), as shown in FIG. 13. Though secondary screw hole is not shown in FIG. 13, the secondary screw hole may be understood to be defined on element 292 directly behind screw 290. An alternate location to attach modular housing 200 to element 292 is shown by alternate secondary screw hole 294, which is also defined by element 292, and represents an alternate position on element 292 that modular housing 200 can attach to using screw extension 218. As would be understood, alternate secondary screw hole 294 is sized similarly to screw hole 284 to allow screw 290 to attach to element 292. Similar sizing of alternate secondary screw hole 294 and screw hole 284 may allow screw 290 to affix to screw hole 284 and to alternate secondary screw hole 294.

In additional or alternate embodiments, modular housing 200 may include only two types of mounts, such as tube mount 214 and flat mount 216. In some embodiments, tube mount 214, flat mount 216 or screw extension 218 may be attached or extend from alternate sides of compartment body 210. For example, tube mount 214 may extend from second side section 226 in some embodiments, with flat mount 216 extending from first side section 224. In certain embodiments, screw extension 218 may extend from first side section 224, second side section 226, third side section 228, or fourth side section 230, depending on the needs of the embodiment. Generally, one of tube mount 214, flat mount 216 and screw extension 218 extends from a side section (e.g., first, second, third, or fourth side sections 224, 226, 228, 230) in the set of side sections.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A modular housing having a lateral, vertical, and transverse direction, the modular housing comprising:
   a compartment body defining a compartment volume for holding circuitry therein, the compartment body comprising a bottom section and a set of side sections extending nonparallelly from the bottom section, the set of side sections comprising a first side section, a second side section, and a third side section;
   a compartment door attached to the compartment body to selectively cover the compartment volume;
   a tube mount curved to accept a circular tube, the tube mount extending from the first side section;
   a flat mount configured to accept to a flat rail, the flat mount extending from the third side section; and
   a screw extension defining a screw hole to accept a screw, the screw extension extending from the second side section in the set of side sections.

2. The modular housing of claim 1, the modular housing comprising a resilient pleat extending between the compartment door and the compartment body, the resilient pleat bendably secured to the compartment door and the compartment body to move with the compartment door relative to the compartment body between an open position and a closed position.

3. The modular housing of claim 2, wherein the compartment body comprises a fourth side section, wherein the compartment door comprises a peripheral rim aligned with the fourth side section in the closed position, and wherein the resilient pleat extends from the fourth side section to the peripheral rim.

4. The modular housing of claim 2, wherein the compartment door is selectively held in friction fit engagement with the compartment body in the closed position.

5. The modular housing of claim 2, the modular housing further defining a connector hole, the connector hole defined through the compartment door and in fluid communication with the compartment volume when the compartment door is in the closed position, wherein the connector hole allows a connector harness to pass through the compartment door and into the compartment volume.

6. The modular housing of claim 1, the tube mount further comprising a first curved foot and a second curved foot, the first curved foot spaced apart from the second curved foot in cooperative alignment therewith to snap around the circular tube.

7. The modular housing of claim 6, the tube mount further comprising a third curved foot,
wherein the first curved foot is laterally spaced apart from the second curved foot, and
wherein the third curved foot is transversely offset from the first curved foot and the second curved foot.

8. The modular housing of claim 1, the flat mount comprising a first leg, a second leg and a pin leg, the first leg parallel to the second leg, the pin leg offset from the first leg and the second leg, the pin leg comprising a pin bump to be received within a pin hole in a flat rail.

9. The modular housing of claim 1, wherein the screw hole is sized to accept a screw to attach the modular housing to an element which defines a secondary screw hole, the secondary screw hole sized similarly to the screw hole.

10. The modular housing of claim 1, the modular housing further comprising a circuit board, the circuit board in the compartment volume and surrounded by the compartment body.

11. An appliance having a lateral, vertical and transverse direction, the appliance comprising:
a circuit board;
a beam; and
a modular housing encasing the circuit board, and attached to the beam, the modular housing comprising:
a compartment body defining a compartment volume, the compartment volume housing the circuit board therein, the compartment body comprising a bottom section and a set of side sections extending nonparallelly from the bottom section, the bottom section and the set of side sections defining the compartment volume, the set of side sections comprising a first side section, a second side section, and a third side section;
a compartment door attached to the compartment body to selectively cover the compartment volume;
a tube mount curved to accept a round rail, the tube mount extending from the first side section;
a flat mount configured to accept to a flat rail, the flat mount extending from the third side section; and
a screw extension defining a screw hole to accept a screw, the screw extension extending from the second side section in the set of side sections.

12. The appliance of claim 11, the modular housing comprising a resilient pleat extending between the compartment door and the compartment body, the resilient pleat bendably secured to the compartment door and the compartment body to move with the compartment door relative to the compartment body between an open position and a closed position.

13. The appliance of claim 12, wherein the compartment body comprises a fourth side section, wherein the compartment door comprises a peripheral rim coplanar with the fourth side section in the closed position, and wherein the resilient pleat extends from the fourth side section to the peripheral rim.

14. The appliance of claim 12, wherein the compartment door is selectively held in friction fit engagement with the compartment body in the closed position.

15. The appliance of claim 11, the tube mount further comprising a first curved foot and a second curved foot, the first curved foot spaced apart from the second curved foot in cooperative alignment therewith to snap around a circular tube.

16. The modular housing of claim 15, the tube mount further comprising a third curved foot,
wherein the first curved foot is laterally spaced apart from the second curved foot, and
wherein the third curved foot is transversely offset from the first curved foot and the second curved foot.

17. The appliance of claim 11, the flat mount comprising a first leg, a second leg and a pin leg, the first leg parallel to the second leg, the pin leg offset from the first leg and the second leg, the pin leg comprising a pin bump to be received within a hole in a flat rail.

18. The appliance of claim 11, the appliance further comprising a connector harness and the modular housing further defining a connector hole, the connector hole defined through the compartment body and in fluid communication with the compartment volume wherein the connector harness passes through the compartment body and into the compartment volume, wherein it is connected to the circuit board.

* * * * *